United States Patent [19]

Takahashi

[11] Patent Number: 4,694,277
[45] Date of Patent: Sep. 15, 1987

[54] A/D CONVERTER

[75] Inventor: Akinori Takahashi, Tokyo, Japan

[73] Assignee: NEC Corporation, Tokyo, Japan

[21] Appl. No.: 831,636

[22] Filed: Feb. 21, 1986

[30] Foreign Application Priority Data

Feb. 22, 1985 [JP] Japan .................................. 60-33807

[51] Int. Cl.$^4$ ........................ H03M 1/52; H03M 1/82
[52] U.S. Cl. ..................... 340/347 NT; 340/347 AD;
340/347 CC; 340/347 M; 324/99 D; 307/497
[58] Field of Search ................. 340/347 NT, 347 AD,
340/347 CC, 347 M; 307/491, 497, 572–574

[56] References Cited
U.S. PATENT DOCUMENTS 3,654,560  4/1972  Cath et al. .................... 340/347 NT
4,308,468 12/1981  Olson ............................. 307/572 X
4,585,956  4/1986  Lie ................................... 307/572 X Primary Examiner—T. J. Sloyan
Attorney, Agent, or Firm—Burns, Doane, Swecker & Mathis

[57] ABSTRACT

A dual slope A/D converter with a zero compensation circuit includes a single power source, an integrator, and a MOS switch constituting the zero compensation circuit and adapted to apply an output voltage to the noninverting input terminal of an operational amplifier constituting the integrator for a zero compensation duration. The A/D converter further includes an amplifier and a MOS transistor with the same characteristics as those of the MOS switch. The gate and source of the MOS transistor are connected to the noninverting input terminal of the operational amplifier. The amplifier doubles a voltage at the noninverting input terminal of the operational amplifier. A doubled voltage is applied to the drain of the MOS transistor.

7 Claims, 2 Drawing Figures

A/D CONVERTER

BACKGROUND OF THE INVENTION

The present invention relates to a single power source operated dual slope A/D converter with an automatic zero compensation circuit.

In a conventional hybrid circuit of a dual slope A/D converter and bipolar and MOS transistors, in order to guarantee stable operation of the A/D converter even in a low-voltage operation range, a threshold voltage of MOS transistor switches (to be referred to as MOS switches hereinafter) constituting switches for the A/D converter must be decreased. When the threshold voltage is decreased to, for example, about 0.2 to 0.5 V, a tailing phenomenon occurs wherein a current exponentially changing with respect to a gate voltage flows even at a voltage lower than a specific threshold voltage of a MOS transistor. Even if the gate voltage is set to be zero in order to turn off in the second step (an integration duration at an input voltage) a MOS switch of the automatic zero compensation circuit which has kept on in the first step (automatic zero compensation duration) of A/D conversion, a capacitor is discharged through this MOS switch. A noninverting input terminal voltage for an operational amplifier constituting the integrator is linearly decreased in the negative direction, resulting in A/D conversion errors.

SUMMARY OF THE INVENTION

It is an object of the present invention to provide an A/D converter which solves the conventional drawback described above and free from an A/D conversion error which is caused by a tailing phenomenon of a MOS switch constituting a zero compensation circuit and having a low threshold voltage.

In order to achieve the above object of the present invention, there is provided an A/D converter with an automatic zero compensation circuit, comprising: a predetermined voltage; an integrator for receiving as input signals the predetermined voltage in a first step of A/D conversion, a difference between the predetermined voltage and an analog voltage to be A/D converted in a second step, a sum of the predetermined voltage and a reference voltage in a third step, the input signals being supplied to an inverting input terminal of an operational amplifier constituting the integrator, a noninverting input terminal of the operational amplifier being connected to one terminal of a capacitor, and the other terminal of the capacitor being grounded; a comparator for comparing the predetermined voltage with an output voltage from the integrator and for generating a coincidence signal representing a coincidence between the two signals and an automatic zero compensation circuit connected to an output terminal of the comparator only for a duration of the first step, the automatic zero compensation circuit including: a first MOS transistor coupled between the output terminal of the comparator and the one terminal of the capacitor; an amplifier for generating a voltage proportional to a potential at the one terminal of the capacitor; and a second MOS transistor which has the same physical configuration as the first MOS transistor and is coupled between the noninverting input terminal of the operational amplifier and an output terminal of the amplifier.

DETAILED DESCRIPTION OF THE PREFERRED EMBODIMENTS

An A/D converter according to an embodiment of the present invention will be described with reference to the accompanying drawings.

Figure 1:
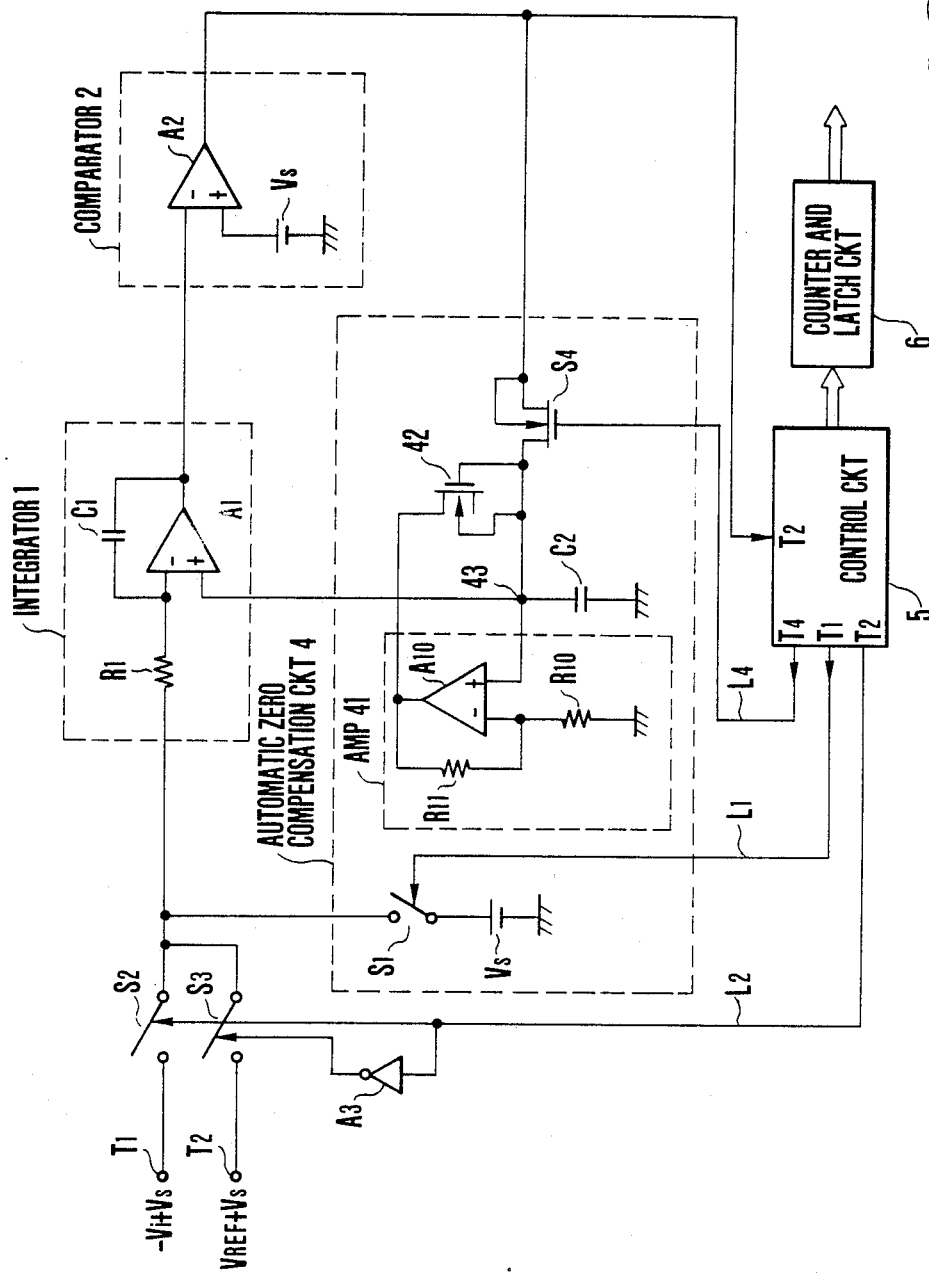
FIG. 1 is a circuit diagram of an A/D converter according to an embodiment of the present invention.

FIG. 1 is a circuit diagram of a single power source operated dual slope A/D converter with an automatic zero compensation circuit. This converter is constituted by an integrated circuit (IC). Referring to FIG. 1, MOS switches S1, S2, S3 and S4 have a low threshold voltage of about 0.2 to 0.5 V so as to guarantee low-voltage operation of the A/D converter. A terminal T1 serves as an input terminal for receiving a voltage Vi of an analog signal subjected to A/D conversion. A terminal T2 serves as an input terminal of a reference signal voltage VREF. The A/D converter uses a single power source Vs with a predetermined voltage Vs. Input signals $-Vi+Vs$ and $VREF+Vs$ biased by the voltage Vs are respectively supplied to the terminals T1 and T2. The input terminal T1 is connected to one terminal of the switch S2 which is turned on/off in response to a control signal supplied from a control circuit 5 through a line L2. The terminal T2 is connected to one terminal of the switch S3 which is turned on/off in response to a control signal which has an inverted phase of the control signal supplied to the switch S2. The control signal received by the switch S3 is supplied from the control circuit 5 through the line L2 and an inverter A3. The other terminal of each of the switches S2 and S3 is connected to one end of a resistor R1 and to one terminal of the switch S1 which is turned on/off in response to a control signal supplied from the control circuit 5 through a line L1. The other terminal of the switch S1 is connected to the positive terminal of the power source Vs. The negative terminal of the power source Vs is grounded. The other terminal of the resistor R1 is connected to the inverting input terminal of an operational amplifier A1. A capacitor C1 is connected between the inverting input terminal and the output terminal of the operational amplifier A1. The noninverting input terminal of the operational amplifier A1 is connected to one terminal of a capacitor C2 (a connecting point therebetween is referred to as a joint 43 hereinafter). The other end of the capacitor C2 is grounded. The operational amplifier A1, the resistor R1, and the capacitors C1 and C2 constitute an integrator 1. The output terminal of the operational amplifier A1, i.e., the output terminal of the integrator 1 is connected to the inverting input terminal of an operational amplifier A2. The noninverting input terminal of the operational amplifier A2 is connected to the positive terminal of the power source Vs. The operational amplifier A2 and the power source Vs constitute a comparator 2. The output terminal of the comparator 2 is connected to the source terminal of the N-MOS switch S4 in an automatic zero compensation circuit 4 and the input terminal T2 of the control circuit 5. The drain of the switch S4 is connected to the joint 43 and to the source and gates of an N-MOS transistor 42 having the same physical structure and characteristics as those of the switch S4. The gate of the switch S4 is connected to a terminal T4 of the control circuit 5 through a line L4. The drain of the transistor 42 is connected to the output terminal of an amplifier 41 with the joint 43 as its input terminal. The amplifier 41 consists of a MOS input operational amplifier A10 and resistors R10 and R11 with an identical resistance. The noninverting input terminal of the operational amplifier A10 is connected to the joint 43. The inverting input terminal of the operational amplifier A10 is connected to one terminal of each of the resistors R10 and R11. The other end of the resistors R10 and R11 is grounded and is connected to the output terminal of the operational amplifier A10, respectively i.e., the output terminal of the amplifier 41. The amplifier 41 serves as a normal phase amplifier for doubling a voltage at the noninverting input terminal of the amplifier 41, i.e., the joint 43. The output terminal of the control circuit 5 is connected to a counter and latch circuit 6. The counter and latch circuit 6 converts an analog control circuit input to a digital signal.

The operation of the A/D converter shown in FIG. 1 will now be described. The A/D converter is known as a dual slope A/D converter with an automatic zero compensation circuit. One A/D conversion cycle for one sampling signal consists of the first, second and third steps. The first step is the automatic zero compensation duration; the second step is the integration duration by the input signal Vi; and the third step is the integration duration by the reference signal VREF. The ON and OFF states of the switches S1 to S4 in the respective steps are summarized in Table 1 below:

TABLE 1

| STEP | | 1 A/D CYCLE | | |
|---|---|---|---|---|
| | | 1 | 2 | 3 |
| CONDITIONS OF SWITCHES | S1 | ON | OFF | OFF |
| | S2 | OFF | ON | OFF |
| | S3 | OFF | OFF | ON |
| | S4 | ON | OFF | OFF |

Figure 2:
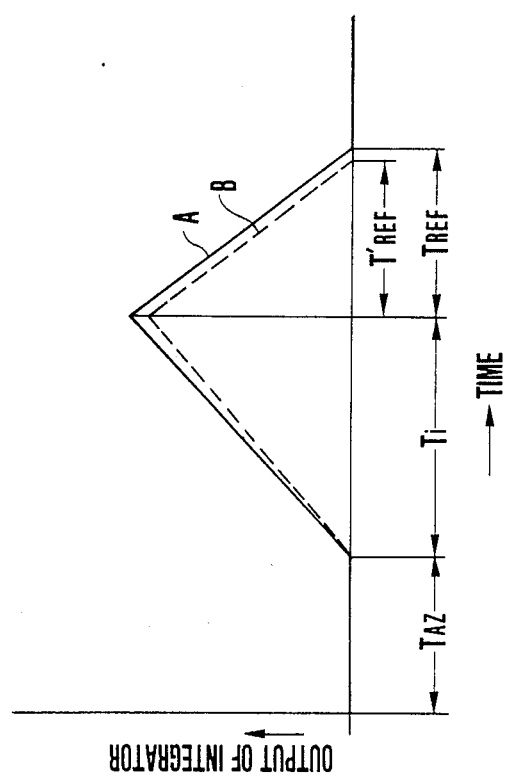
FIG. 2 is a timing chart for explaining the operation of the A/D converter in FIG. 1.

FIG. 2 shows a waveform of an output from the integrator 1 in one A/D conversion cycle. Time intervals TAZ, Ti and TREF represent durations of the first, second and third steps. In principle, a reference voltage (zero) of the output from the integrator 1 is determined in the interval TAZ preset by the control circuit 5. In the second step, integration is performed at the input voltage Vi for the interval Ti preset by the control circuit 5, so that an output from the integrator 1 is linearly increased. In the third step, the output from the integrator 1 is linearly decreased as opposed to the case in the second step. The comparator 2 monitors the output voltage from the integrator 1. When this output voltage reaches a value given in the first step, the comparator 2 supplies a control signal to the control circuit 5 and measures the duration TREF of the third step. The basic equation therefor is:

$$Vi = (VREF/Ti)TREF \quad (1)$$

As is apparent from equation (1), T-V conversion is performed such that Vi is calculated by TREF.

The operation of the A/D converter in FIG. 1 will be described in more detail. The switches S1 and S4 are turned on in the first step, and then the gain of a system including the integrator 1 and the comparator 2 is 1. A sum Vs+VOS1 of the input voltage Vs to the integrator 1 and an input offset VOS1 to the operational amplifier A1 appears without modification and charges the capacitor C2. In the second step, only the switch S2 is turned on, so that the input signal with the voltage $-Vi+Vs$ is supplied from the input terminal T1 to the integrator 1. An output from the integrator 1 changes from an input offset VOS2 of the operational amplifier A2 and is linearly increased. In the second step, the operation characteristics of the A/D converter (FIG. 1) with the amplifier 41 and the transistor 42 and the operation of the conventional A/D converter are represented by a solid line A and broken line B in FIG. 2. The following drawback is presented by the conventional A/D converter. Since the threshold voltage of the MOS switch S4 is set as low as, for example, 0.25 to 0.5 V, the MOS switch is kept ON due to the tailing phenomenon inherent to MOS transistors even after the gate voltage reaches 0 V. As a result, the circuit is kept ON at the beginning of the second step even after the gate voltage of the switch S4 reaches 0 V. The capacitor C2 is discharged through the switch S4 and then the voltage at the terminal 43 of the capacitor C2, i.e., the noninverting input terminal of the operational amplifier A1 is linearly decreased. This voltage drop appears as an A/D conversion error.

When a current for the gate voltage of 0 V in the MOS switch S4 is given as Ie, the following equation is derived:

$$Vi = (C1R1/C2)Ie \cdot (Ti + TREF)/Ti + (VREF/Ti) \cdot TREF \quad (2)$$

The first term of equation (2) is an error due to Ie. For example, if C1=0.1 μF, R1=50 kΩ, Ti=10 ms, TREF=10 ms, C2=0.01 μF, and Ie=100 mA, the first term represents 100 mV which causes a Vi error. As indicated by broken line B in FIG. 2, the output from the integrator 1 is decreased at the end of the second step. The slope does not change in the third step, so that the third step duration measured by the control circuit 5 is given as TREF'.

However, in the A/D converter (FIG. 1) with the amplifier 41 and the transistor 42, the voltage at the terminal 43 of the capacitor C2 is doubled by the amplifier 41. A doubled voltage is applied to the drain of the transistor 42. Since the capacitor C2 is charged with Vs+VOS1, a voltage in the source-drain path of the transistor 42 is substantially equal to Vs. Therefore, the current Ie supplied by tailing to the switch S4 can be cancelled by the current from the transistor 42 since the current from the transistor 42 has substantially the same magnitude but a polarity opposite to that of the current Ie. The value presented by the first term of equation (2) is negligibly small. The output from the integrator 1 is thus as indicated by solid line A in FIG. 2, and thus an accurate TREF can be measured and the A/D conversion error can be eliminated.

According to the present invention as described above, the MOS transistor 42 with the same arrangement and characteristics as those of the MOS switch S4 constituting the zero compensation circuit, and the normal phase doubling amplifier 41 are added to the MOS switch S4, thereby obtaining a high-precision A/D converter operated in a low voltage range and with a single power source.

The A/D converter can be easily integrated as a C-MOS IC circuit using the MOS input operational amplifier A10. Therefore, an A/D converter with higher precision can be obtained.

What is claimed is:

1. An A/D converter with an automatic zero compensation circuit, comprising: a predetermined voltage; an integrator for receiving as input signals the predetermined voltage in a first step of A/D conversion, a difference between the predetermined voltage and an analog voltage to be A/D converted in a second step, a sum of the predetermined voltage and a reference voltage in a third step, the input signals being supplied to an inverting input terminal of an operational amplifier constituting said integrator, a noninverting input terminal of said operational amplifier being connected to one terminal of a capacitor, and the other terminal of said capacitor being grounded; a comparator for comparing the predetermined voltage with an output voltage from said integrator and for generating a coincidence signal representing a coincidence between the two signals; and an automatic zero compensation circuit connected to an output terminal of said comparator only for a duration of the first step, said automatic zero compensation circuit including: a first MOS transistor coupled between said output terminal of said comparator and said one terminal of said capacitor; an amplifier for substantially doubling a voltage at said one terminal of said capacitor; and a second MOS transistor which has the same physical configuration as said first MOS transistor and is coupled between said noninverting input terminal of said operational amplifier and an output terminal of said amplifier.

2. A converter according to claim 1, further comprising control means for controlling durations of the first to third steps of A/D conversion and for generating a signal representing the duration of the third step in response to the coincidence signal from said comparator; and counter and latch means for counting an output signal from said control means and generating an A/D-converted digital output.

3. A converter according to claim 1, wherein said amplifier includes an operational amplifier, a noninverting input terminal of which is connected to said one terminal of said capacitor, a first resistor being connected between an inverting input terminal and an output terminal of said operational amplifier, and a second resistor with the same resistance as that of said first resistor being connected between said inverting input terminal and ground.

4. An A/D converter with an automatic zero compensation circuit, comprising: a predetermined voltage; an integrator for receiving as input signals the predetermined voltage in a first step of A/D conversion, a difference between the predetermined voltage and an analog voltage to be A/D converted in a second step, a sum of the predetermined voltage and a reference voltage in a third step, the input signals being supplied to an inverting input terminal of a first operational amplifier constituting said integrator, a noninverting input terminal of said first operational amplifier being connected to one terminal of a capacitor, and the other terminal of said capacitor being grounded; a comparator for comparing the predetermined voltage with an output voltage from said integrator and for generating a coincidence signal representing a coincidence between the two signals; and an automatic zero compensation circuit connected to an output terminal of said comparator only for a duration of the first step, said automatic zero compensation circuit including: a first MOS transistor coupled between said output terminal of said comparator and said one terminal of said capacitor; an amplifier for generating a voltage proportional to a potential at said one terminal of said capacitor, said amplifier including a second operational amplifier, a noninverting input terminal of which is connected to said one terminal of said capacitor, a first resistor being connected between an inverting input terminal and an output terminal of said second operational amplifier, and a second resistor with the same resistance as that of said first resistor being connected between said inverting input terminal of said second operational amplifier and ground; and a second MOS transistor which has the same physical configuration as said first MOS transistor and is coupled between said noninverting input terminal of said operational amplifier and an output terminal of said amplifier.

5. An A/D converter with an automatic zero compensation circuit, comprising: a predetermined voltage; an integrator for receiving as input signals the predetermined voltage in a first step of A/D conversion, a difference between the predetermined voltage and an analog voltage to be A/D converted in a second step, a sum of the predetermined voltage and a reference voltage in a third step, the input signals being supplied to an inverting input terminal of a first operational amplifier constituting said integrator, a noninverting input terminal of said first operational amplifier being connected to one terminal of a capacitor, and the other terminal of said capacitor being grounded; a comparator for comparing the predetermined voltage with an output voltage from said integrator and for generating a coincidence signal representing a coincidence between the two signals; and an automatic zero compensation circuit connected to an output terminal of said comparator only for a duration of the first step, said automatic zero compensation circuit including: a first MOS transistor coupled between said output terminal of said comparator and said one terminal of said capacitor; an amplifier for generating a voltage proportional to a potential at said one terminal of said capacitor; and a second MOS transistor which has the same physical configuration as said first MOS transistor and is coupled between said noninverting input terminal of said first operational amplifier and an output terminal of said amplifier, whereby said second MOS transistor and said amplifier cooperate with each other to compensate a leakage current to said first MOS transistor in order to maintain the potential at said one terminal of said capacitor.

6. A converter according to claim 5, further comprising control means for controlling durations of the first to third steps of A/D conversion and for generating a signal representing the duration of the third step in response to the coincidence signal from said comparator; and counter and latch means for counting an output signal from said control means and generating an A/D-converted digital output.

7. A converter according to claim 5, wherein said amplifier includes a second operational amplifier, a noninverting input terminal of which is connected to said one terminal of said capacitor; a first being connected between an inverting input terminal and an output terminal of said second operational amplifier; and a second resistor with the same resistance as that of said first resistor being connected between said inverting input terminal of said second operational amplifier and ground.

* * * * *